United States Patent
Lee et al.

(10) Patent No.: US 7,507,592 B2
(45) Date of Patent: Mar. 24, 2009

(54) BONDING PAD STRUCTURE FOR A DISPLAY DEVICE AND FABRICATION METHOD THEREOF

(75) Inventors: Chun-Yu Lee, Tainan County (TW); Shy-Ping Chou, Taoyuan County (TW); Hui-Chang Chen, Kaohsiung (TW)

(73) Assignee: AU Optronics Corp., Hsinchu (TW)

( * ) Notice: Subject to any disclaimer, the term of this patent is extended or adjusted under 35 U.S.C. 154(b) by 54 days.

(21) Appl. No.: 11/688,954

(22) Filed: Mar. 21, 2007

(65) Prior Publication Data

US 2007/0155156 A1 Jul. 5, 2007

Related U.S. Application Data

(62) Division of application No. 10/891,921, filed on Jul. 15, 2004, now Pat. No. 7,211,738.

(30) Foreign Application Priority Data

Oct. 2, 2003 (TW) ............................... 92127277 A

(51) Int. Cl.
 *H01L 21/60* (2006.01)
(52) U.S. Cl. ..................... 438/25; 438/26; 438/612; 257/E23.02; 257/E33.066
(58) Field of Classification Search .............. 438/25, 438/26, 612, 637, FOR. 355; 257/E23.02, 257/E33.066
See application file for complete search history.

(56) References Cited

U.S. PATENT DOCUMENTS

| | | | |
|---|---|---|---|
| 3,319,317 A * | 5/1967 | Roche et al. .................. 216/18 |
| 5,532,853 A * | 7/1996 | Song et al. .................. 349/149 |
| 6,028,367 A * | 2/2000 | Yu ............................. 257/780 |
| 6,065,341 A | 5/2000 | Ishio et al. |
| 6,372,409 B1 * | 4/2002 | Yu ............................. 430/313 |
| 6,388,207 B1 | 5/2002 | Figueroa et al. |
| 6,417,087 B1 * | 7/2002 | Chittipeddi et al. ......... 438/612 |
| 6,548,767 B1 * | 4/2003 | Lee et al. .................... 174/262 |
| 6,713,685 B1 * | 3/2004 | Cotton ....................... 174/262 |
| 7,005,752 B2 | 2/2006 | Bojkov et al. |
| 7,069,646 B2 | 7/2006 | Duxbury et al. |
| 2001/0001427 A1 | 5/2001 | Atakov et al. |
| 2001/0041548 A1 * | 11/2001 | Bult et al. ................. 455/252.1 |
| 2002/0011349 A1 | 1/2002 | Kragl et al. |
| 2002/0023778 A1 * | 2/2002 | Watanabe ................... 174/262 |
| 2002/0180001 A1 * | 12/2002 | Woo et al. ................... 257/546 |
| 2003/0042499 A1 * | 3/2003 | Reiner ........................ 257/173 |
| 2003/0049886 A1 | 3/2003 | Salmon |
| 2003/0121700 A1 | 7/2003 | Schmidt |
| 2003/0146020 A1 * | 8/2003 | Brist et al. .................. 174/262 |
| 2003/0164911 A1 * | 9/2003 | Eguchi et al. ............... 349/113 |
| 2003/0188888 A1 * | 10/2003 | Yoshioka et al. ............ 174/262 |
| 2005/0023700 A1 * | 2/2005 | Singh et al. ................. 257/773 |

* cited by examiner

*Primary Examiner*—George Fourson
(74) *Attorney, Agent, or Firm*—Thomas, Kayden, Horstemeyer & Risley

(57) ABSTRACT

A bonding pad structure of a display device. A first conductive layer is formed overlying a substrate, a protection layer is formed overlying the substrate and the first conductive layer, and a second conductive layer is formed overlying the protection layer. An opening structure penetrates the second conductive layer and the protection layer to expose the first conductive layer. A third conductive layer is formed overlying the second conductive layer to contact the sidewall and bottom of the opening structure. Thus, the third conductive layer is electrically connected to the second conductive layer to provide a first electrical-connection path, and the third conductive layer is electrically connected to the first conductive layer to provide a second electrical-connection path.

19 Claims, 9 Drawing Sheets

BONDING PAD STRUCTURE FOR A DISPLAY DEVICE AND FABRICATION METHOD THEREOF

CROSS REFERENCE TO RELATED APPLICATIONS

This application is a Divisional of pending U.S. patent application Ser. No. 10/891,921, filed Jul. 15, 2004 and entitled "Bonding Pad Structure For A Display Device And Fabrication Method Thereof" (the contents of which are incorporated by reference), which claimed the benefit of Taiwan application 92127277, filed Oct. 2, 2003.

BACKGROUND OF THE INVENTION

1. Field of the Invention

The invention relates to a display device, and more particularly to a liquid crystal display (LCD) device with a bonding pad structure for electrically connecting external driving devices. An opening structure design on the bonding pad structure can provide an auxiliary electrical-connection path to replace a failed electrical-connection path caused by a defective conductive layer.

2. Description of the Related Art

Liquid crystal display (LCD) device is the most popular flat panel display and has characteristics of low power consumption, thin profile, light weight and low driving voltage. Generally, the LCD device has an array of pixel areas defined by scanning lines and data lines, and each pixel area has a pixel electrode and a thin film transistor (TFT) serving as a switching device. In addition, a plurality of bonding pad structures is fabricated on the terminals of the scanning lines and the data lines respectively to be electrically connected to external driving ICs through TAB (tape automatic bonding) or FPCB (flexible print circuit board) techniques, thus driving the pixel electrodes and providing image signals.

FIG. 1 is a plane view of a conventional LCD device. An LCD device 10 comprises a TFT substrate 12, a CF (color filter) substrate 14 and a liquid crystal material filling in a space between the substrates 12 and 14. A plurality of bonding pad structures is formed at the peripheral region of the TFT substrate 12 to be electrically connected to an external IC board 18 through a signal processing substrate 16, such as a TAB substrate or a FPCB.

FIG. 2 is a plane view of the TFT substrate 12 with bonding pads. The TFT substrate 12 comprises a plurality of scanning lines 20 and data lines 22 which vertically intersect to define an array of pixel areas 24. Each scanning line 20 has a terminal portion 20a, and a bonding pad 26 is formed overlying and electrically connected to the terminal portion 20a, thus the bonding pad 26 can be electrically connected to the external IC board 18 through the signal processing substrate 16. Similarly, each data line 22 has a terminal portion 22a, and a bonding pad 26 is formed overlying and electrically connected to the terminal portion 22a, thus the bonding pad 26 can be electrically connected to the external IC board 18 through the signal processing substrate 16.

FIG. 3 is a cross-section along line 3-3 of FIG. 2 to illustrate an example of a conventional bonding pad structure. On the peripheral region of the TFT substrate 12, a first metal layer M1 is patterned as the terminal portion 20a, a protection layer 25 is formed overlying the first metal layer M1 and has an opening to expose a predetermined electrical-connection area of the terminal portion 20a, and an ITO (indium tin oxide) layer is patterned as the bonding pad 26 to be electrically connected to the terminal portion 20a through the opening of the protection layer 25. Additionally, the first metal layer M1 is patterned as the scanning lines 20, and the ITO layer is patterned as pixel electrodes.

FIG. 4 is a cross-section along line 4-4 of FIG. 2 to illustrate an example of a conventional bonding pad structure. On the peripheral region of the TFT substrate 12, a first metal layer M1 is patterned as the scanning line 20, a protection layer 25 is formed overlying the first metal layer M1, a second metal layer M2 is formed overlying the protection layer 25 and patterned as the terminal portion 22a, and an ITO (indium tin oxide) layer is patterned as a bonding pad 26 to be electrically connected to the terminal portion 22a. The second metal layer M2 is also patterned as the data lines 22, and the ITO layer is patterned as pixel electrodes.

FIG. 5 is a cross-section illustrating the conventional bonding pad structure of FIG. 4 electrically connected to the external IC board. In TAB or FPC processing, when defects are found and in need of repair, the TAB film or FPC film is stripped off, and then the glue of an anisotropic conductive film (ACF) 17 remaining on the glass is cleaned off, and then a new TAB film or FPC film is pasted on the glass substrate. The metal layers, however, may be scratched by improper operation during cleaning the remaining glue, subsequent testing steps or improper manual procedures. When the scratched portion 19 is large enough to crosscut the metal layer, the conductive particles of the ACF 17 adjacent to the scratched portion 19 encounter a problem of insufficient contact area. Thus, the electrical-connection path shown by an arrow dotted line fails to pass through the scratched portion 19, causing poor reliability and flawed product.

SUMMARY OF THE INVENTION

Accordingly, an object of the present invention is to provide a bonding pad structure with an opening design for a liquid crystal display (LCD) device in order to provide an auxiliary electrical-connection path to replace a failed electrical-connection path caused by a defective conductive line.

According to the object of the invention, a first conductive layer is formed overlying a substrate, a protection layer is formed overlying the substrate and the first conductive layer, and a second conductive layer is formed overlying the protection layer. An opening structure penetrates the second conductive layer and the protection layer to expose the first conductive layer. A third conductive layer is formed overlying the second conductive layer to contact the sidewall and bottom of the opening structure. Thus, the third conductive layer is electrically connected to the second conductive layer to provide a first electrical-connection path, and the third conductive layer is electrically connected to the first conductive layer to provide a second electrical-connection path.

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

The present invention is a display device with a bonding pad structure electrically connected to an external driving device. An opening structure design on the bonding pad structure can provide an auxiliary electrical-connection path to replace a failed electrical-connection path caused by a defective conductive layer. The bonding pad structure can be applied to an LCD (liquid crystal display) device or an OLED (organic electro-luminescent display) device. The bonding pad structure is formed on the terminal of a scanning line, a data line or the combination thereof.

First Embodiment

Figure 1:
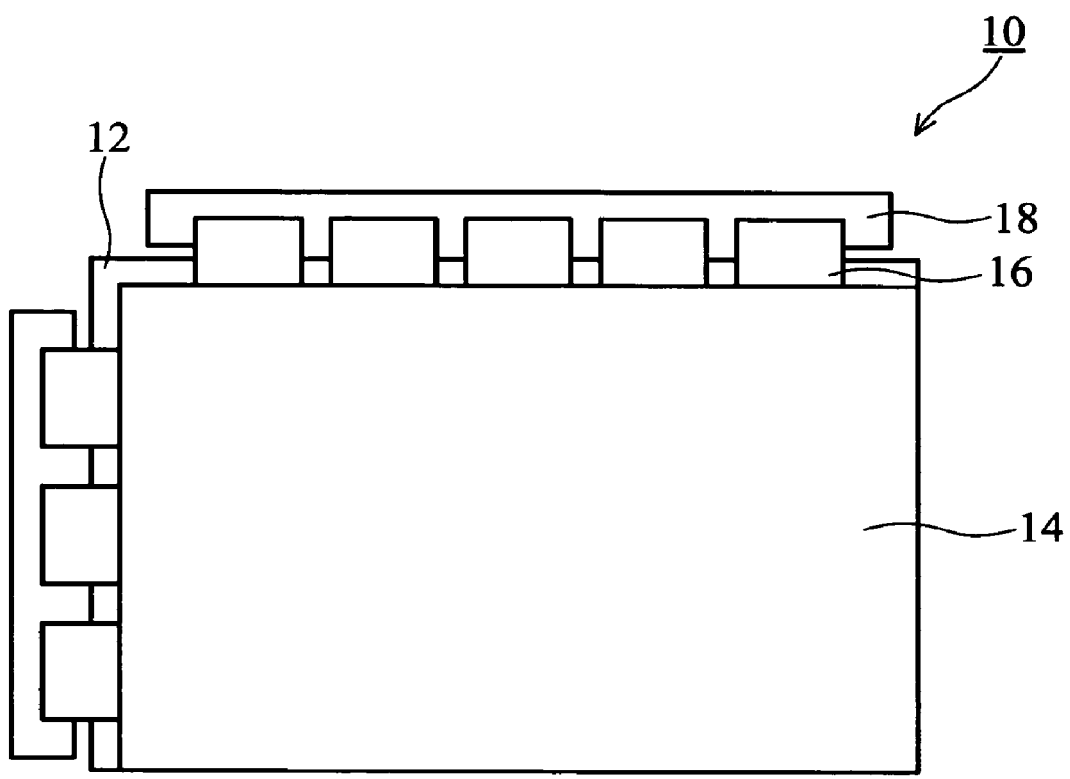
FIG. 1 is a plane view of a conventional LCD device.
Figure 2:
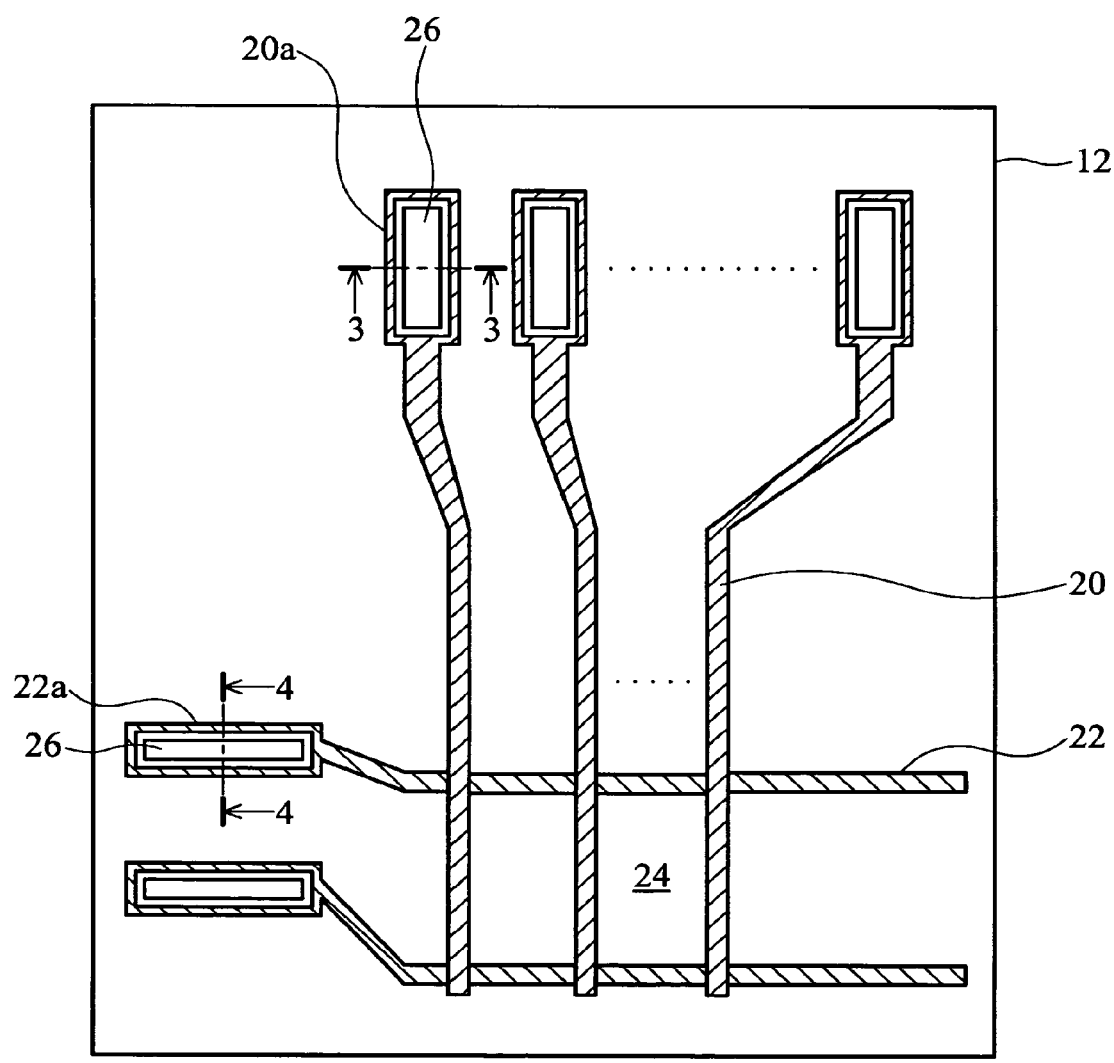
FIG. 2 is a plane view of the TFT substrate shown in FIG. 1.
Figure 3:
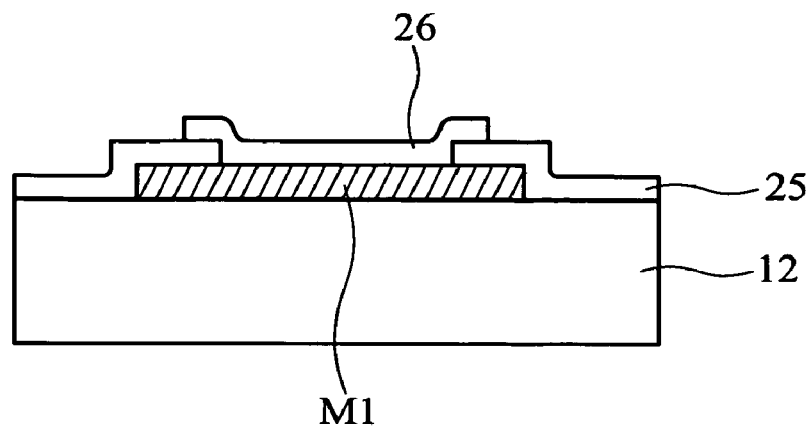
FIG. 3 is a cross-section along line 3-3 of FIG. 2 to illustrate an example of a conventional bonding pad structure.
Figure 4:
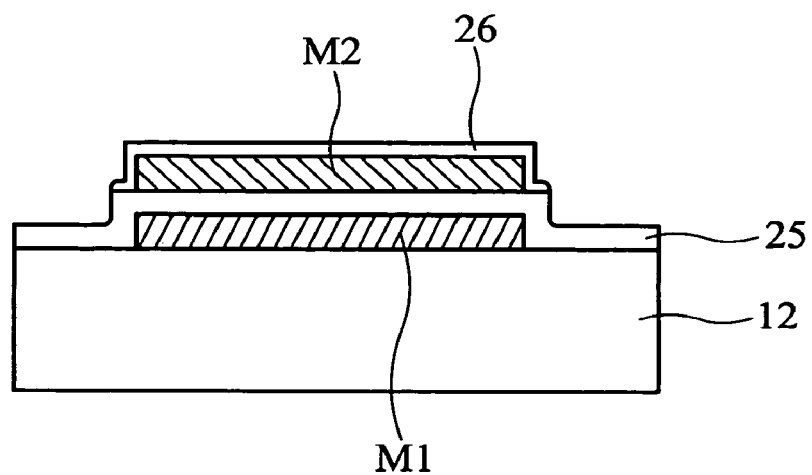
FIG. 4 is a cross-section along line 4-4 of FIG. 2 to illustrate an example of a conventional bonding pad structure.
Figure 5:
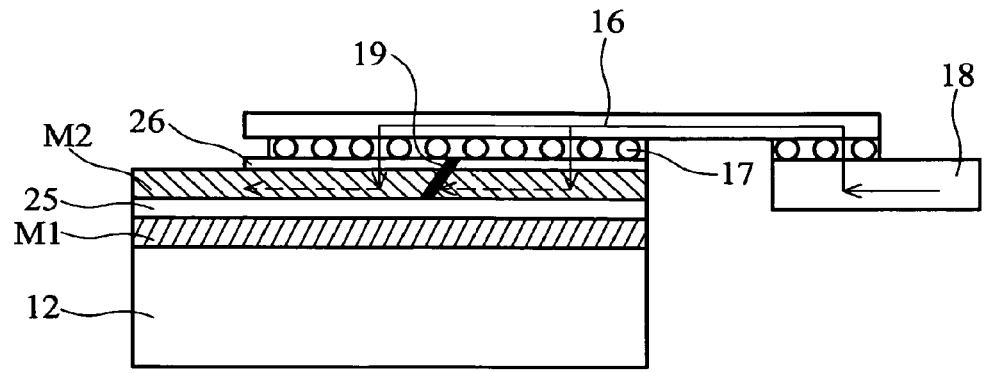
FIG. 5 is a cross-section illustrating the conventional bonding pad structure of FIG. 4 electrically connected to the external IC board.
Figure 6:
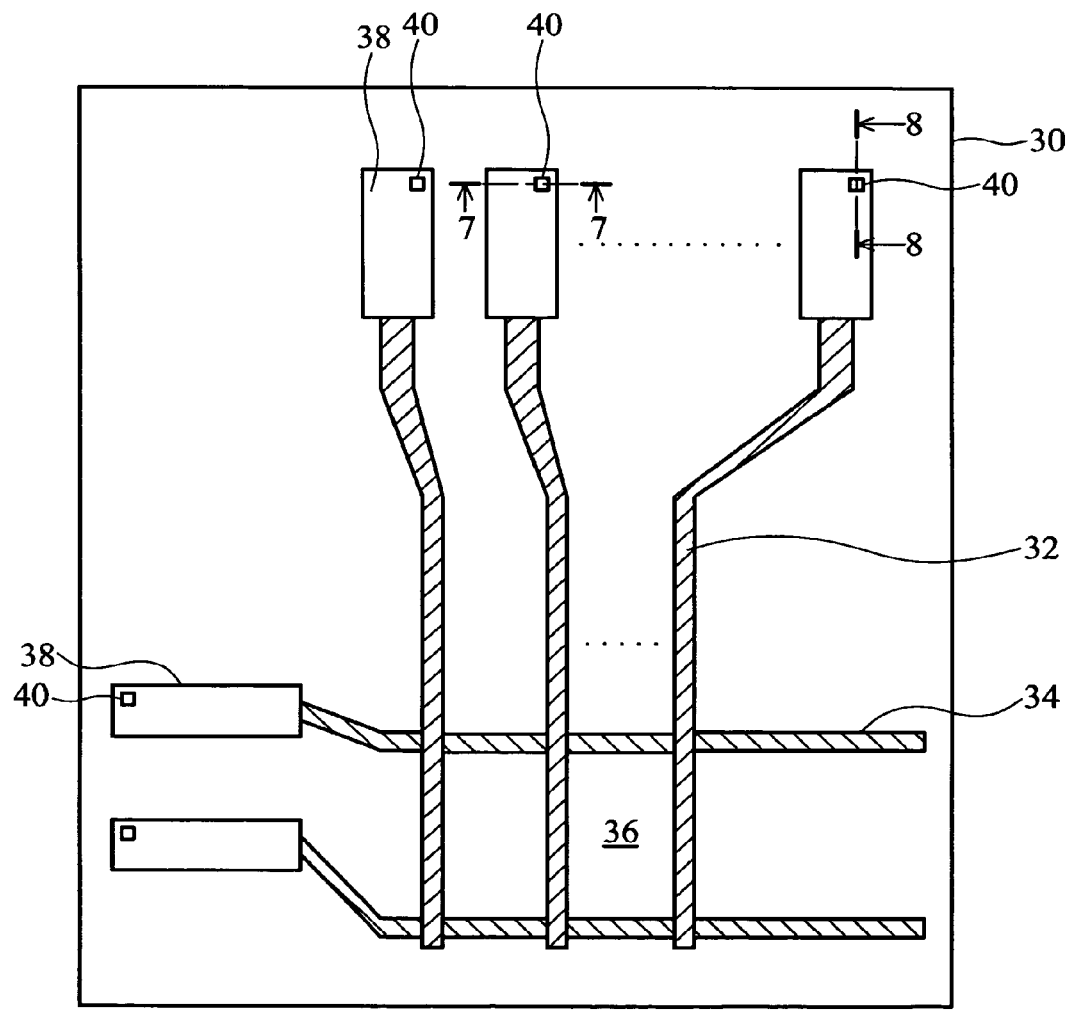
FIG. 6 is a plane view of a bonding pad structure according to the first embodiment of the present invention.

FIG. 6 is a plane view of a bonding pad structure according to the first embodiment of the present invention. A display substrate 30 comprises a plurality of scanning lines 32 extending along a first direction and a plurality of data lines 34 extending along a second direction, which intersect to define an array of pixel areas 36. Each pixel area 36 comprises a switching device (such as a TFT device) and a pixel electrode. Each scanning line 32 has a terminal portion on which a bonding pad 38 is formed and electrically connected to an external IC board through a signal processing substrate. Similarly, each data line 34 has a terminal portion on which a bonding pad 38 is formed and electrically connected to an external IC board through a signal processing substrate. In addition, an opening structure 40 is designed beneath each bonding pad 38 to make the bonding pad 38 contact two conductive layers simultaneously, resulting in two electrical-connection paths.

Figure 7:
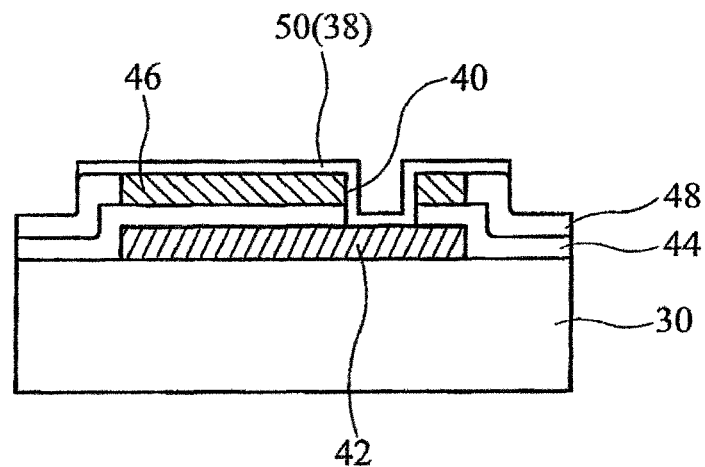
FIG. 7 is a cross-section along line 7-7 of FIG. 6 illustrating a bonding pad structure according to the first embodiment of the present invention.

FIG. 7 is a cross-section along line 7-7 of FIG. 6 illustrating a bonding pad structure according to the first embodiment of the present invention. On the peripheral region of the display substrate 30, the bonding pad structure comprises a first conductive layer 42, a first protection layer 44, a second conductive layer 46, a second protection layer 48 and a third conductive layer 50. A fabrication method for the bonding pad structure is described below. The first conductive layer 42 is deposited on the display substrate 30, and then patterned as the scanning lines 32 and the terminal portions thereof by lithography and etching. Then, the first protection layer 44 is deposited on the display substrate 30 to cover the first conductive layer 42. Next, the second conductive layer 46 is deposited on the first protection layer 44 and then patterned as the data lines 34 and the terminal portions thereof by lithography and etching. Next, using lithography and etching, the opening structure 40 is formed to penetrate the second conductive layer 46 and the first protection layer 44, thus exposing a predetermined electrically connecting area of the first conductive layer 42. Next, the second protection layer 48 is deposited to cover the second conductive layer 46 and the first protection layer 44, and then the second protection layer 48 remaining in the opening structure 40 and on the top of the second conductive layer 46 is removed by an etching back process. Finally, the third conductive layer 50 is conformally deposited, and then patterned as the bonding pad 38 and the pixel electrode by lithography and etching. The third conductive layer 50 contacts the bottom and sidewalls of the opening structure 40, thus the bonding pad 38 is electrically connected to the second conductive layer 46 to provide a first electrical-connection path, and the bonding pad 38 is electrically connected to the first conductive layer 42 to provide a second electrical-connection path. Preferably, the third conductive layer 50 is a transparent conductive layer, such as an ITO layer.

Figure 8:
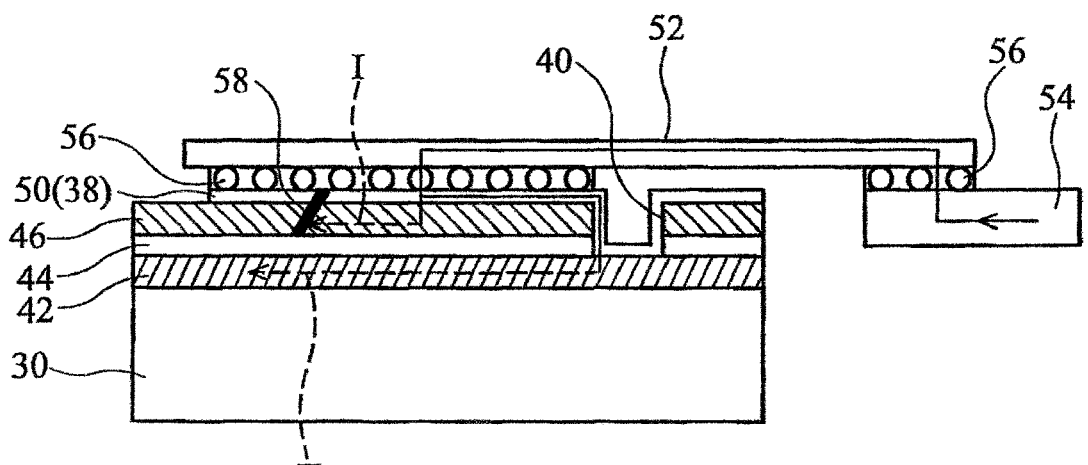
FIG. 8 is a cross-section along line 8-8 of FIG. 6 illustrating the bonding pad structure electrically connected to an external IC board through a signal processing substrate.

FIG. 8 is a cross-section along line 8-8 of FIG. 6 illustrating the bonding pad structure electrically connected to an external IC board through a signal processing substrate. In TAB or FPC processing, the bonding structure fabricated on the peripheral region of the display substrate 30 is connected to an external IC board 54 through a signal processing substrate 52 (such as a TAB substrate or a FPCB). Also, a conductive adhesion film 56 (such as an anisotropic conductive film) is employed to simultaneously achieve adhesion and electrical connection between the bonding pad 38 and the signal processing substrate 52. Similarly, the conductive adhesion film 56 is employed to simultaneously achieve adhesion and electrical connection between the external IC board 54 and the signal processing substrate 52.

When defects are found and in need of repair, the TAB film or FPC film is stripped off, and then the remaining glue of the conductive adhesion film 56 is cleaned off, and then a new TAB film or FPC film is pasted thereon. However, the second conductive layer 46 may be scratched by improper operation during cleaning the remaining glue, subsequent testing steps or improper manual procedures. When the scratched portion 58 is large enough to crosscut the second conductive layer 46, the conductive particles of the conductive adhesion film 56 adjacent to the scratched portion 58 lack sufficient contact area, thus failing the first electrical-connection path I. Comparatively, in the present invention, the third conductive layer 50 can contact the first metal layer 42 through the opening structure 40 to provide the second electrical-connection path II as an auxiliary electrical-connection path which replaces the first electrical-connection path I, thus preventing short circuits and increasing product reliability. Also, the first protection layer 44 sandwiched between the first conductive layer 42 and the second conductive layer 44 can increase structural strength adjacent to the opening structure 40 to ensure the conductivity of the third conductive layer 50.

Second Embodiment

The bonding pad structure and the fabrication method thereof in the second embodiment are substantially similar to those of the first embodiment, and similar portions omitted herein. The different portion is the profile and number of the opening structure 40. In each bonding pad structure of the first embodiment, the opening structure 40 is one via. In each bonding pad structure of the second embodiment, the opening structure 40 may be a plurality of vias, a strip trench or a circuit trench.

Figure 9:
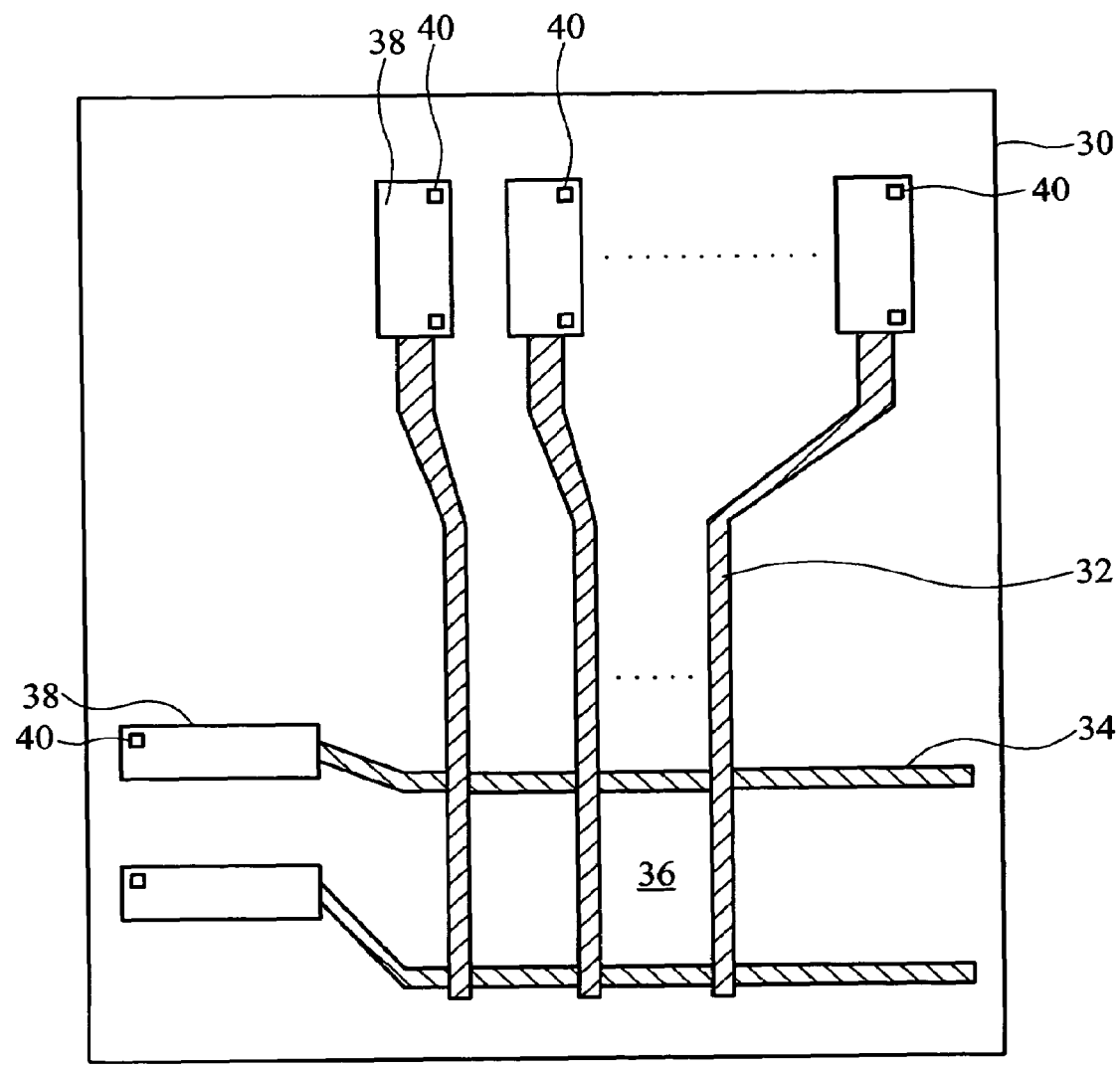
FIG. 9 is a plane view illustrating an example of bonding pad structures according to the second embodiment of the present invention.
Figure 10:
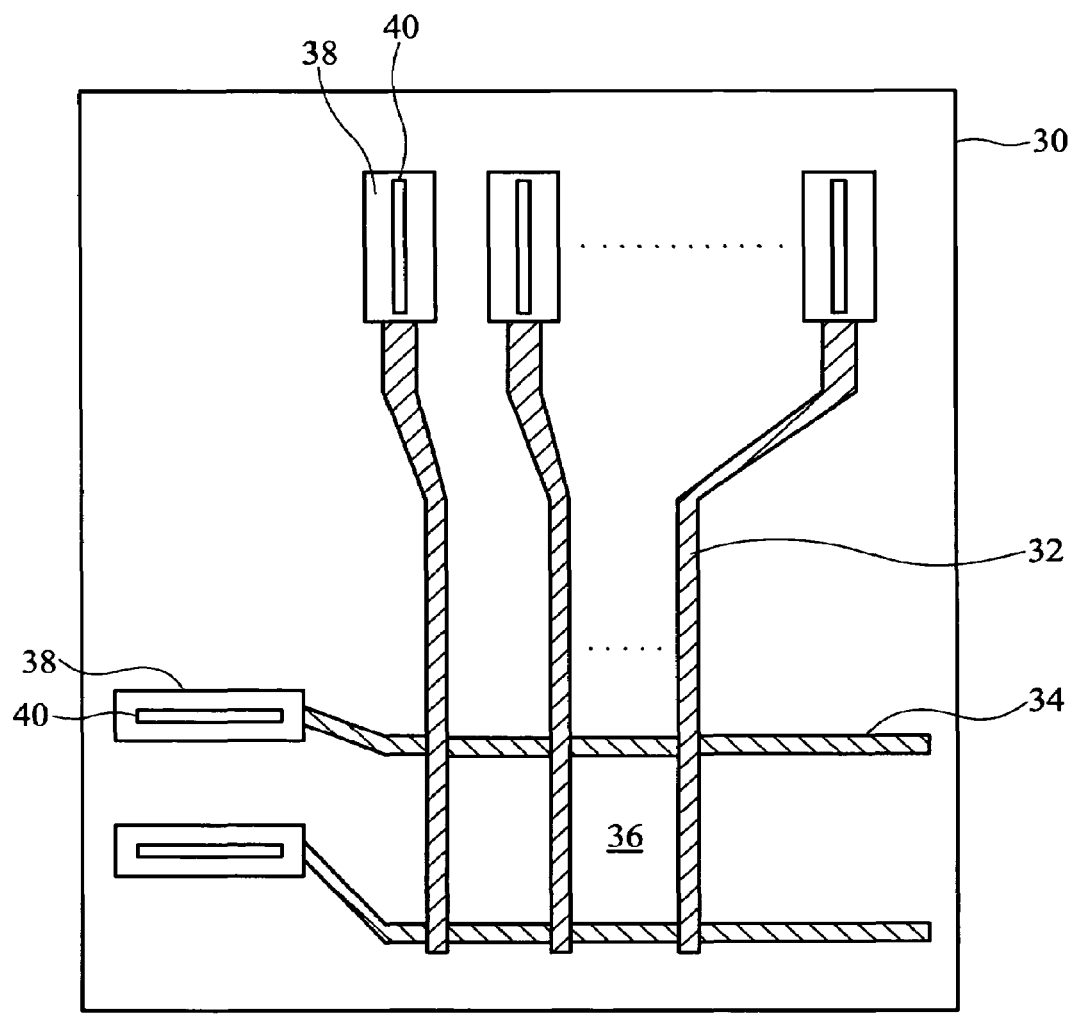
FIG. 10 is a plane view illustrating an example of bonding pad structures according to the second embodiment of the present invention.
Figure 11A:
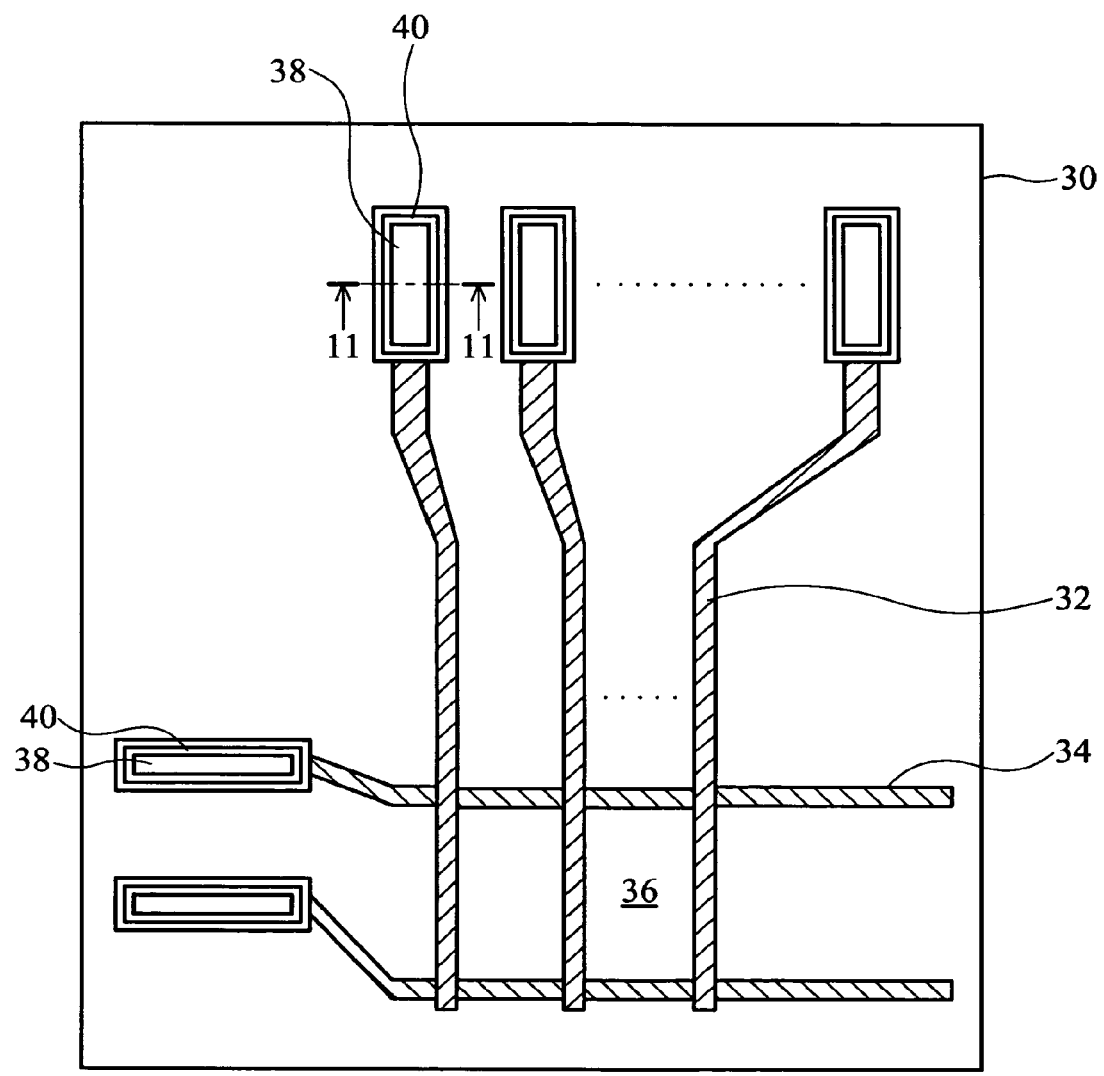
FIG. 11A is a plane view illustrating an example of bonding pad structures according to the second embodiment of the present invention.
Figure 11B:
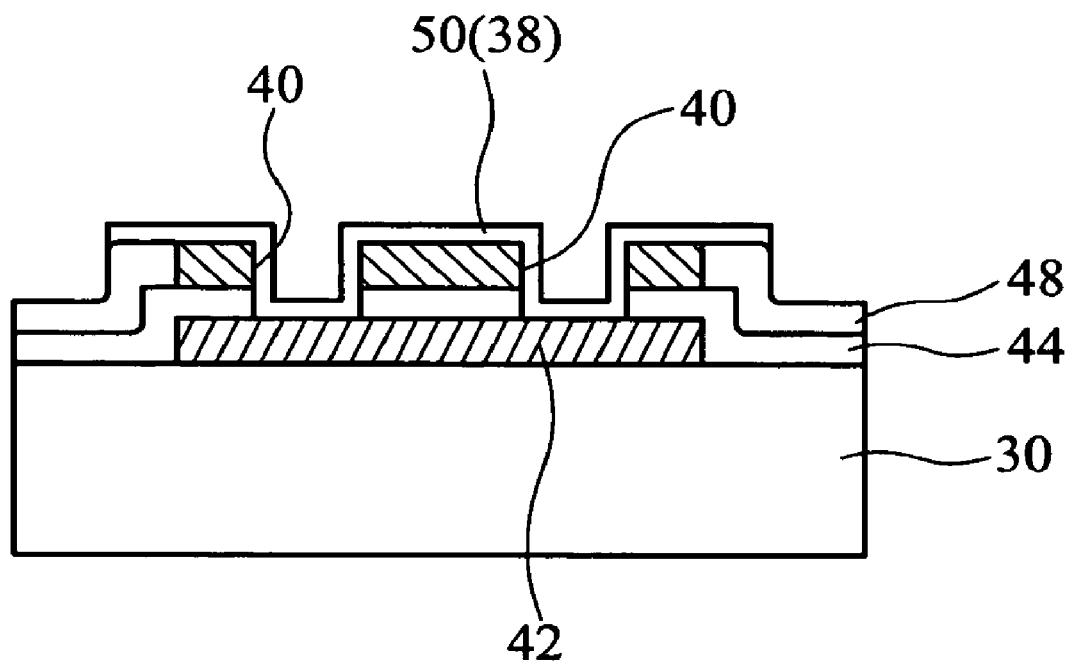
FIG. 11B is a cross-section along line 11-11 of FIG. 11A illustrating the bonding pad structure according to the second embodiment of the present invention.

FIGS. 9, 10 and 11A are plane views illustrating examples of bonding pad structures according to the second embodiment of the present invention. FIG. 11B is a cross-section along line 11-11 of FIG. 11A illustrating the bonding pad structure according to the second embodiment of the present invention.

In FIG. 9, each opening structure 40 comprises at least two vias, and the diameter, symmetry and arrangement of the vias are not limited.

In FIG. 10, each opening structure 40 comprises at least one strip trench, and the length, width, extending direction and number of the strip trench are not limited.

In FIGS. 11A and 11B, each opening structure 40 comprises at least one enclosed circuit trench which surrounds the periphery of the bonding pad structure, and the width and profile of the enclosed circuit trench are not limited.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fabrication method for a bonding pad structure of a display device, comprising the steps of:
   providing a substrate;
   forming a first conductive layer overlying the substrate;
   forming a protection layer overlying the substrate and the first conductive layer;
   forming a second conductive layer overlying the protection layer;
   forming an opening structure penetrating the second conductive layer and the protection layer to expose the first conductive layer; and
   forming a third conductive layer overlying the second conductive layer to contact the sidewall and bottom of the opening structure;
   wherein, the third conductive layer is electrically connected to the second conductive layer to provide a first electrical-connection path;
   wherein, the third conductive layer is electrically connected to the first conductive layer to provide a second electrical-connection path; and
   wherein the third conductive layer is a transparent conductive layer or an ITO layer.

2. The fabrication method for a bonding pad structure of a display device as claimed in claim 1, wherein the opening structure comprises one via.

3. The fabrication method for a bonding pad structure of a display device as claimed in claim 1, wherein the opening structure comprises a plurality of vias.

4. The fabrication method for a bonding pad structure of a display device as claimed in claim 1, wherein the opening structure comprises at least one strip trench.

5. The fabrication method for a bonding pad structure of a display device as claimed in claim 1, wherein the opening structure comprises at least one enclosed circuit trench.

6. The fabrication method for a bonding pad structure of a display device as claimed in claim 1, wherein the third conductive layer is a bonding pad which is connected to an external IC board through a signal processing substrate.

7. The fabrication method for a bonding pad structure of a display device as claimed in claim 6, wherein the signal processing substrate is a TAB (tape automatic bonding) substrate or a FPCB (flexible printed circuit board).

8. The fabrication method for a bonding pad structure of a display device as claimed in claim 6, wherein a conductive adhesion film is formed between the third conductive layer and the signal processing substrate.

9. The fabrication method for a bonding pad structure of a display device as claimed in claim 8, wherein the conductive adhesion film is an anisotropic conductive film (ACF).

10. A fabrication method for a bonding pad structure of a display device, comprising the steps of:
    providing a substrate having a plurality of scan lines and data lines;
    forming a first conductive layer overlying the substrate;
    forming a protection layer overlying the substrate and the first conductive layer;
    forming a second conductive layer overlying the protection layer;
    forming an opening structure penetrating the second conductive layer and the protection layer to expose the first conductive layer; and
    forming a third conductive layer overlying the second conductive layer to contact the sidewall and bottom of the opening structure;
    wherein, the third conductive layer is electrically connected to the second conductive layer to provide a first electrical-connection path;
    wherein, the third conductive layer is electrically connected to the first conductive layer to provide a second electrical-connection path; and
    wherein, the first electrical-connection path and the second electrical-connection path electrically connect the third conductive layer and the data lines or scan lines.

11. The fabrication method for a bonding pad structure of a display device as claimed in claim 10, wherein the opening structure comprises one via.

12. The fabrication method for a bonding pad structure of a display device as claimed in claim 10, wherein the opening structure comprises a plurality of vias.

13. The fabrication method for a bonding pad structure of a display device as claimed in claim 10, wherein the opening structure comprises at least one strip trench.

14. The fabrication method for a bonding pad structure of a display device as claimed in claim 10, wherein the opening structure comprises at least one enclosed circuit trench.

15. The fabrication method for a bonding pad structure of a display device as claimed in claim 10, wherein the third conductive layer is a transparent conductive layer or an ITO layer.

16. The fabrication method for a bonding pad structure of a display device as claimed in claim 10, wherein the third conductive layer is a bonding pad which is connected to an external IC board through a signal processing substrate.

17. The fabrication method for a bonding pad structure of a display device as claimed in claim 10, wherein the signal processing substrate is a TAB (tape automatic bonding) substrate or a FPCB (flexible printed circuit board).

18. The fabrication method for a bonding pad structure of a display device as claimed in claim 10, wherein a conductive adhesion film is formed between the third conductive layer and the signal processing substrate.

19. The fabrication method for a bonding pad structure of a display device as claimed in claim 18, wherein the conductive adhesion film is an anisotropic conductive film (ACF).

* * * * *